United States Patent [19]

Wu

[11] Patent Number: 5,506,533
[45] Date of Patent: Apr. 9, 1996

[54] APPARATUS FOR GENERATING A MONOSTABLE SIGNAL

[75] Inventor: Tsung-hsun Wu, Taoyuan, Taiwan

[73] Assignee: Acer Peripherals, Inc., Taoyuan, Taiwan

[21] Appl. No.: 520,617

[22] Filed: Aug. 30, 1995

[51] Int. Cl.$^6$ .................................................. H03K 3/033
[52] U.S. Cl. ............................ 327/227; 327/172
[58] Field of Search .................................... 327/172, 227

[56] References Cited

U.S. PATENT DOCUMENTS

| | | | |
|---|---|---|---|
| 4,965,465 | 10/1990 | Denda | 327/172 |
| 4,979,194 | 12/1990 | Kawano | 327/172 |
| 5,402,009 | 3/1995 | Kiyota | 327/172 |

*Primary Examiner*—Margaret Rose Wambach
*Attorney, Agent, or Firm*—Fish & Richardson

[57] ABSTRACT

An apparatus for generating a monostable signal is disclosed. The apparatus comprises a flip-flop, an oscillation circuit, a counter and a comparison circuit. The flip-flop, in response to a trigger signal, activates a first edge transition of the monostable signal at an output terminal. The oscillation circuit generates a pulse train, responsive to the first edge transition. The counter counts number of pulses of the pulse train. The comparison circuit, comparing the output of the counter with a predetermined value, generates a clear signal to said flip-flop in order to activate a second edge transition of the monostable signal. The desired pulse width of the output signal is controlled by the predetermined value.

3 Claims, 1 Drawing Sheet

APPARATUS FOR GENERATING A MONOSTABLE SIGNAL

TECHNICAL FIELD OF THE INVENTION

The present invention relates to a signal generating apparatus, and, in particular, relates to an apparatus for generating an output signal of a desired pulse width.

BACKGROUND OF THE INVENTION

In the field of electrical system, e.g. a monitor control system, a signal of a desired pulse width is frequently needed to be the input signal of other circuits of the electrical system.

One of the conventional approaches uses an external resistor-capacitor circuit together with a monostable multivibrator, i.e. IC 74LS221, which responds to a trigger signal to output a signal of the desired pulse width at the output terminal of the monostable multivibrator. The desired pulse width of the signal is determined by the RC constant of the resistor-capacitor circuit. However, this type of analog approach, on one hand, is not easily implemented on a digital integrated circuit since the circuit of the monostable multivibrator is in analog nature. On the other hand, the analog approach is sensitive to the noise signal. Other related prior arts include U.S. Pat. Nos. 4,598,412, 4,994,687, 5,059,812, 5,124,573 and 5,422,585.

U.S. Pat. No. 4,598,412 discloses a binary digital data signal reproducing circuit. The binary digital data signal is prepared at a transmitter side and is converted to a bipolar signal which is sent out to a digital transmission line. Due to waveform distortion during transmission, the signal is received at a receiver side, which is the input terminal of the pulse detect circuit. The object of Yoshida is to generate the binary digital data signal at the Q terminal of the Flip-Flop, which is a reproduction of the binary digital data signal. Therefore, each bit of the signal "i" has a length T which is totally identical to that of each bit of the signal "a". Due to the circuit construction of Yoshida, the bit length T of binary digital data signal "i" is fixed and can not be altered. Furthermore, the timing relation between the signal "i" and "a" is an asynchronous one, which is the result of the application of the clock signal generated from the clock pulse generator 12.

U.S. Pat. No. 5,124,573 discloses a circuit for reducing or expanding the duty cycle of a clock input signal. It is important to note Wong uses the set terminal of a Reset Dominant latch for receiving the clock input signal, and delay signal is dependent both on the clock out signal and clock in signal. Furthermore, the delay block of Wong is so complicated that the delay time Td are dependent on many factors, for instance, the turn on voltage of T6, the voltage pick off point of the charge voltage at node 62, RC time constant of cell 50 and many others.

The apparatus of U.S. Pat. No. 5,422,585 includes a flip-flop, a delay circuit and a clear circuit. The flip-flop, in response to a first trigger signal, outputs the output signal at an output terminal. The delay circuit generates a second trigger signal by delaying the output signal for a predetermined amount of time. The clear circuit, in response to the second trigger signal, generates a clear signal to the flip-flop in order to clear the output signal. The desired pulse width of the output signal is controlled by the predetermined amount of time delayed in the delay circuit.

SUMMARY OF THE INVENTION

The present invention provides a signal generating apparatus from which a signal of a desired pulse width, i.e. a monostable (one shot) signal, is obtained.

The apparatus of the invention includes a flip-flop, an oscillation circuit, a counter and a comparison circuit. The flip-flop, in response to a trigger signal, activates a first edge transition of the monostable signal at an output terminal. The oscillation circuit generates a pulse train at its output terminal. The counter counts number of pulses of the pulse train. The comparison circuit, comparing the output of the counter with a predetermined value saved in a register, generates a clear signal to the flip-flop. The desired pulse width of the monostable signal is controlled by the predetermined value stored in the register.

The invention may be further understood by the following detailed descriptions on the invention along with the appended drawings.

DETAILED DESCRIPTION OF THE INVENTION

Figure 1:
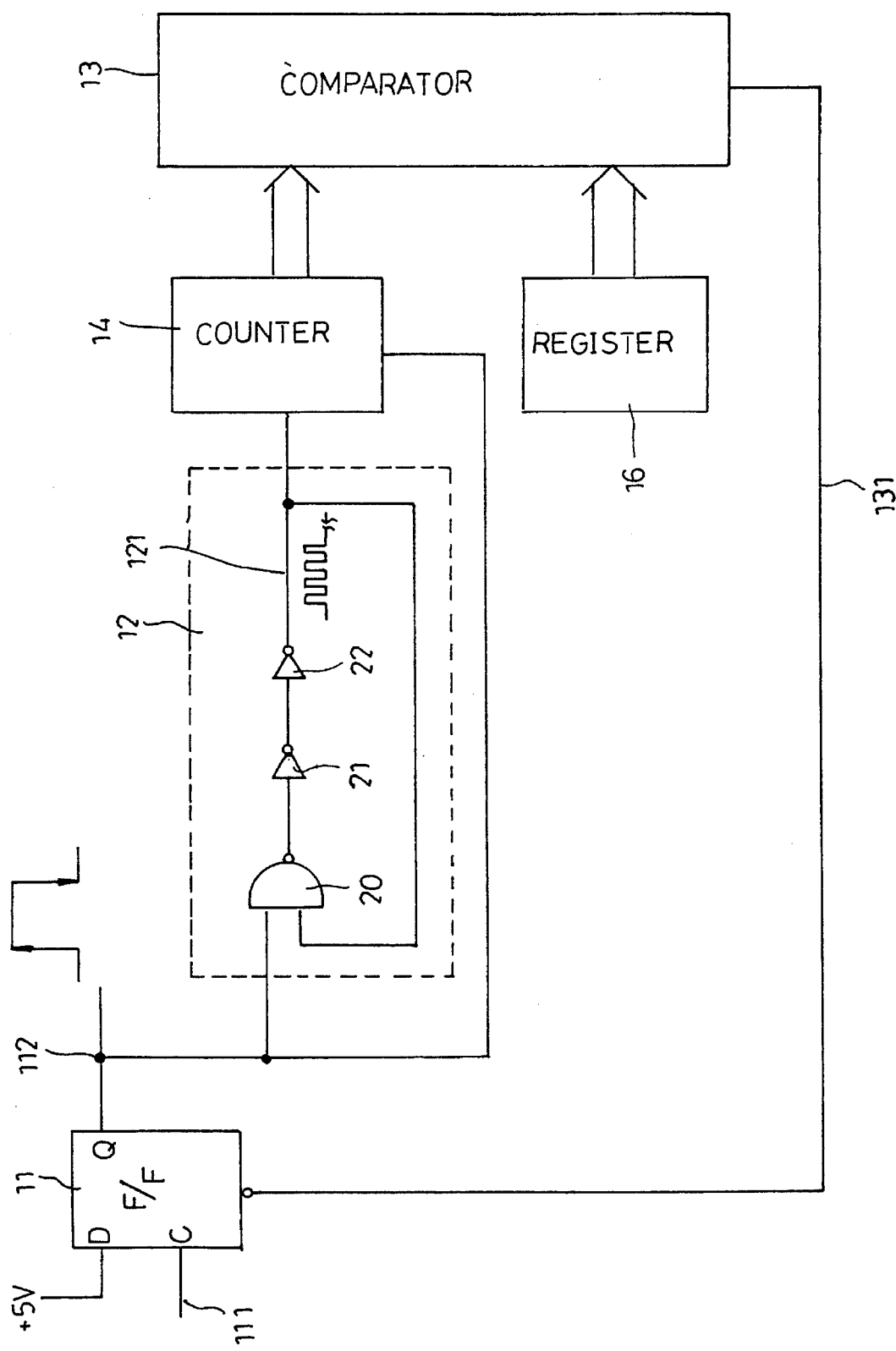
FIG. 1 shows basic circuit block in accordance with the invention.

Referring to FIG. 1, the invention includes a flip-flop 11, an oscillation circuit 12, a counter 14 and a comparison circuit 13.

The flip-flop 11, in response to a trigger signal 111, activates a first edge transition of the monostable signal 112 at the output terminal (Q).

The oscillation circuit 12 inputs the monostable signal 112 and, responsive to the first edge transition, generates a pulse train 121.

The counter 14 counts number of pulses of the pulse train 121. Each time the first edge transition of the monostable signal is activated, the counter 14 is reset to zero.

The comparison circuit 13, comparing the output of the counter 14 with a predetermined value output from the register 16, generates a clear signal 131 to clear the flip-flop 11. In other words, responsive to the clear signal 131, the flip-flop 11 activates a second edge transition of the monostable signal 112.

The frequency of the pulse train 121 is determined by the time delay caused by the devices in the oscillation circuit 12. The time duration of the pulse of the monostable signal 112 is determined by the value stored in the register 16. By altering the value of the parameters within the register 16, the pulse width of the monostable signal 112 is therefore changed as desired.

One preferred embodiment of the oscillation circuit 12 has a NAND gate 20 and a first inverter 21 and a second inverter 22.

The NAND gate 20 has a first input, a second input and an output. The first input receives the monostable signal 112, the second input is coupled to the output terminal of the oscillation circuit 12.

The first inverter 21 has an input coupled to the output of the NAND gate, and has an output.

The second inverter 22 has an input coupled to the output of the first inverter 21, and an output forming the output terminal of the oscillation circuit 12.

The flip-flop 11 has a clock input terminal inputing the trigger signal 111, a data terminal coupled to a reference voltage (+5V), and a clear terminal inputing the clear signal 131. Instead of the shown D type flip-flop 11, other types of flip-flop may also be used along with required modifications to the associated circuits to achieve the purpose of the invention. The modifications to the apparatus of the invention which is equivalent to a person skilled in the art are still within the intended scope of protection of the invention which is defined by the following appended claims.

What is claimed is:

1. An apparatus for generating a monostable signal, comprising:

a flip-flop having an output terminal for outputing said monostable signal, the flip-flop, responsive to a trigger signal, activating a first edge transition of said monostable signal, and, responsive to a clear signal, activating a second edge transition of said monostable signal;

an oscillation circuit having an output terminal, responsive to the first edge transition of the monostable signal, for generating a pulse train at the output terminal;

a counter counting number of pulses of the pulse train;

a comparison circuit, comparing the number counted by the counter with a predetermined value, for generating the clear signal to said flip-flop.

2. The apparatus as recited in claim 1, wherein the flip-flop has a clock input terminal for receiving said trigger signal, a data terminal coupled to a reference voltage, and a clear terminal for receiving said clear signal.

3. The apparatus as recited in claim 1, wherein the oscillation circuit comprises an NAND gate having a first input, a second input and an output, the first input receiving the monostable signal, the second input being coupled to the output terminal of the oscillation circuit;

a first inverter having an input coupled to the output of the NAND gate, and an output;

a second inverter having an input coupled to the output of the first inverter, and an output forming the output terminal of the oscillation circuit.

* * * * *